United States Patent
Marzo et al.

(10) Patent No.: US 12,261,597 B2
(45) Date of Patent: Mar. 25, 2025

(54) CAPACITOR CHARGING METHOD, CORRESPONDING CIRCUIT AND DEVICE

(71) Applicant: STMicroelectronics S.r.l., Agrate Brianza (IT)

(72) Inventors: Alberto Marzo, Giarret (IT); Vincenzo Randazzo, Biancavilla (IT); Vanni Poletto, Milan (IT); Giovanni Susinna, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/321,568

(22) Filed: May 22, 2023

(65) Prior Publication Data
US 2023/0403005 A1    Dec. 14, 2023

(30) Foreign Application Priority Data
Jun. 14, 2022    (IT) .......................... 102022000012617

(51) Int. Cl.
*H03K 17/687* (2006.01)
*H03K 17/0412* (2006.01)
*H03K 17/06* (2006.01)

(52) U.S. Cl.
CPC ..... *H03K 17/687* (2013.01); *H03K 17/04123* (2013.01); *H03K 17/063* (2013.01)

(58) Field of Classification Search
CPC ........... H03K 17/687; H03K 17/04123; H03K 17/063; H02J 2207/50; H02J 7/007182; H02J 7/00304
See application file for complete search history.

(56) References Cited

U.S. PATENT DOCUMENTS

| | | | | |
|---|---|---|---|---|
| 2013/0278300 | A1* | 10/2013 | Domingo | H03K 17/302 327/109 |
| 2017/0220058 | A1 | 8/2017 | Petenyi et al. | |
| 2017/0230599 | A1* | 8/2017 | Abiru | H03M 1/66 |
| 2018/0013294 | A1* | 1/2018 | Edelson | H03K 17/162 |
| 2021/0288486 | A1* | 9/2021 | Kitano | H02H 3/087 |

FOREIGN PATENT DOCUMENTS

NL    1029133 C2    11/2006

* cited by examiner

*Primary Examiner* — Metasebia T Retebo
(74) *Attorney, Agent, or Firm* — SLATER MATSIL, LLP

(57) ABSTRACT

In embodiments, a capacitance is coupled to a source of electrical charge via a drain to source current flow path through a field-effect transistor. The capacitance is precharged by making the field-effect transistor selectively conductive in response to the gate-source voltage of the field-effect transistor exceeding a threshold. The difference between the gate-source voltage of the field-effect transistor and the threshold provides an overdrive value of the field-effect transistor. The gate of the field-effect transistor is driven with a variable gate-source voltage having as a target maintaining a constant overdrive value. Electrical charge is controllably transferred from the source to the capacitance via the drain to source current flow path through the field-effect transistor avoiding undesirably high inrush currents.

20 Claims, 6 Drawing Sheets

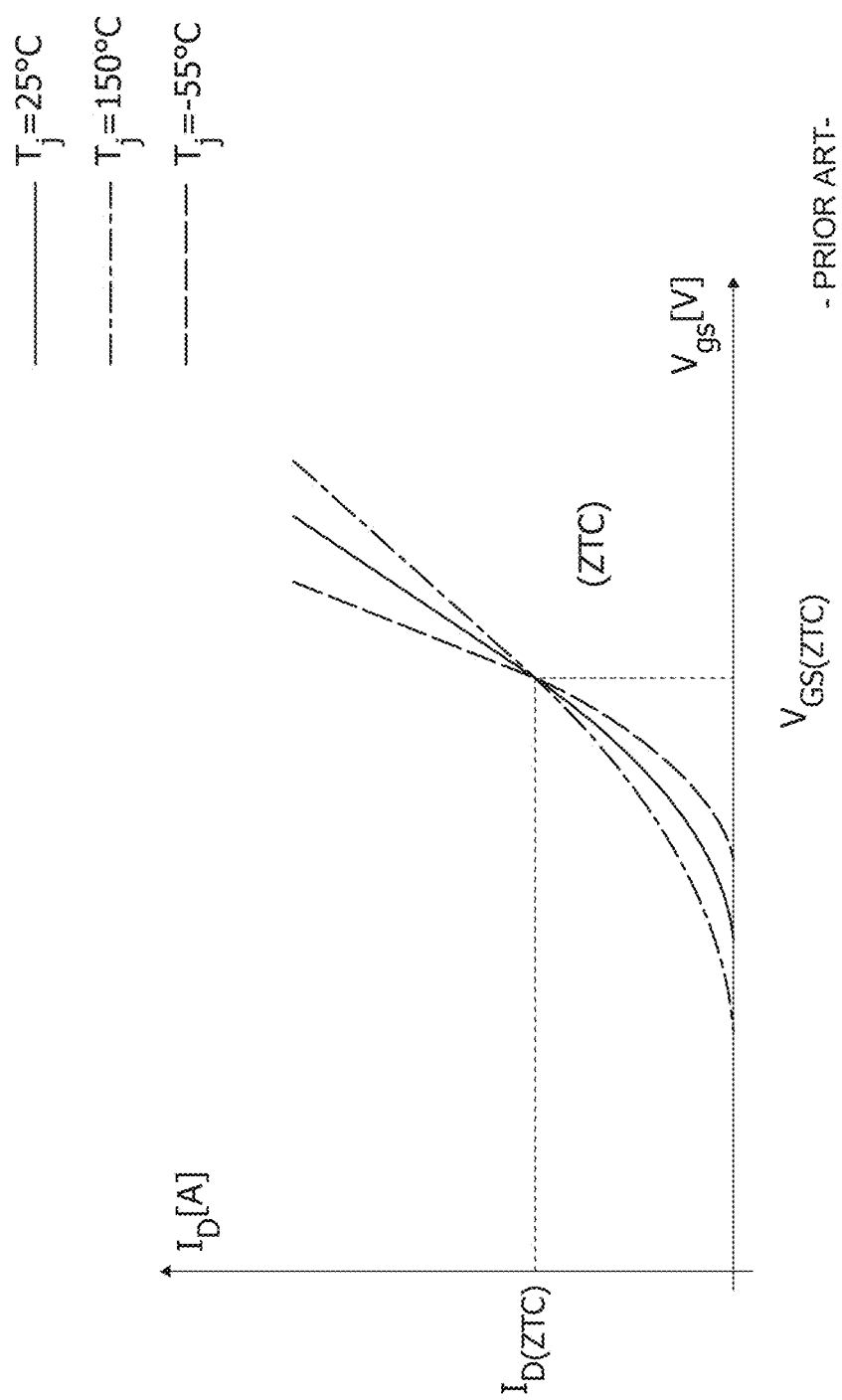

CAPACITOR CHARGING METHOD, CORRESPONDING CIRCUIT AND DEVICE

CROSS-REFERENCE TO RELATED APPLICATIONS

This application claims priority to Italian Application No. 102022000012617, filed on Jun. 14, 2022, which application is hereby incorporated by reference herein in its entirety.

TECHNICAL FIELD

The present disclosure generally relates to capacitor pre-charging and, in particular embodiments, to an electronic fuse (e-fuse or eFuse) for use in the automotive sector.

BACKGROUND

In a current circuit topology for electronic fuses (hereinafter, eFuses) power elements are connected to a power source such as a battery to supply one or more electrical loads. Generally, eFuses are designed and sized to drive loads with a certain nominal current and switch off power elements in case the current exceeds the nominal value. The load may have, connected in parallel, a large capacitor, in the range of a few mF to tens of mF. It is desired that, at startup, the eFuse should be able to charge this large capacitor before a nominal current is started to be provided to the load.

This desired mode of operation has disadvantages, such as the capacitive load is required to be charged in a relatively short time frame (e.g., about 50 to about 200 ms), when the output voltage is zero, the capacitor behaves like a short circuit, and if the eFuse switches power elements in a fully "on" mode, a large current will flow and it becomes difficult for the eFuse to discriminate between a high current due to normal charging of a large capacitive load and an actual short-circuit condition. It is thus desirable that the charging process of the capacitive load should follow a desired strategy.

SUMMARY

An object of one or more embodiments is to contribute to providing improved solutions to address the issues discussed in the foregoing.

Such an object can be achieved via a method having the features set forth in the claims that follow. One or more embodiments may relate to a corresponding circuit. One or more embodiments may relate to a corresponding device. Devices for use, e.g., in the automotive sector, and including one or more eFuses may be exemplary of such a device. The claims are an integral part of the technical disclosure provided in connection with the embodiments.

Solutions presented by example relate to load capacitor pre-charging for eFuse applications wherein an undesirably high "inrush" current is avoided.

Solutions presented by example can be applied in a high-side configuration wherein a current through an electronic switch (a MOSFET transistor, for instance) and a load is controlled as a function of the gate-source voltage of the MOSFET transistor and an associated threshold value.

In the solutions presented, the current is controlled by setting a gate-source voltage until the MOSFET transistor enters the fully "on" region, thus avoiding an undesirably high inrush current. In solutions presented herein, a capacitance coupled to a source of electrical charge (a battery, for instance) via a drain to source current flow path through a field-effect transistor, is (pre)charged by making the field-effect transistor selectively conductive in response to the gate-source voltage of the field-effect transistor exceeding an (e.g., temperature-dependent) threshold. The difference between the gate-source voltage of the field-effect transistor and the threshold provides an overdrive value of the field-effect transistor.

In the solutions presented, the gate of the field-effect transistor is driven with a variable gate-source voltage by targeting (that is, having as a target) and maintaining a constant overdrive value. Electrical charge is thus controllably transferred from the source to the capacitance via the drain to source current flow path through the field-effect transistor.

BRIEF DESCRIPTION OF THE DRAWINGS

One or more embodiments will now be described, by way of example only, with reference to the annexed figures, wherein:

FIG. 3 presents various possible FET current/voltage characteristics;

The figures are drawn to clearly illustrate the relevant aspects of the embodiments and are not necessarily drawn to scale. Corresponding numerals and symbols in the figures generally refer to corresponding parts unless otherwise indicated. The edges of features drawn in the figures do not necessarily indicate the termination of the extent of the feature. Also, throughout this description, a same designation may be used for brevity to designate a certain node or line and a signal occurring at that node or line, and a certain component (e.g., a capacitor or a resistor) and an electrical parameter thereof (e.g., capacitance or resistance/impedance).

DETAILED DESCRIPTION OF ILLUSTRATIVE EMBODIMENTS

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised of at least one embodiment. Hence, phrases such as "in an embodiment," "in one embodiment," or the like, that may be present in various points of the present description do not necessarily refer exactly to one and the same embodiment. Furthermore, particular conformations, structures, or characteristics may be combined in any adequate way in one or more embodiments.

The headings/references used herein are provided merely for convenience and hence do not define the extent of protection or the scope of the embodiments. Also, throughout the figures, like parts or elements are indicated with like reference symbols, and a corresponding description will not be repeated for each and every figure for brevity.

Figure 1:
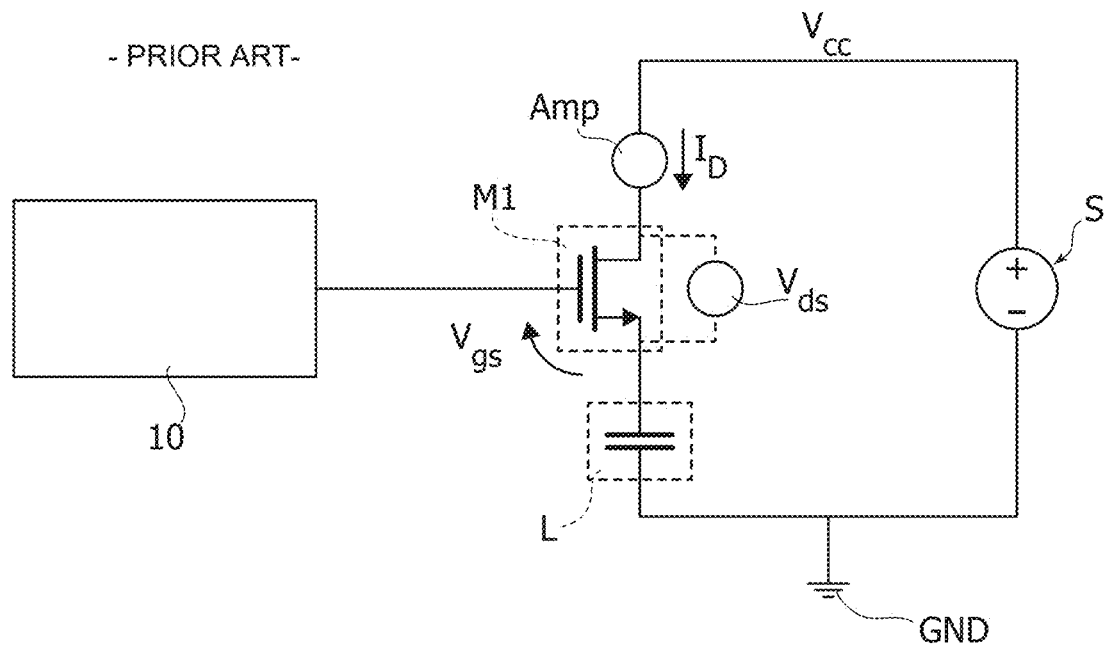
FIG. 1 is a circuit diagram of a conventional electronic fuse (eFuse)

In a conventional arrangement, as exemplified in FIG. 1, an eFuse device 10 is configured to control an external switch (a field-effect transistor such as a MOSFET transistor M1, for instance). The switch M1 is configured to couple an electrical load L to a supply source such as a battery S at a voltage $V_{CC}$. The electrical load L may have a high capacitive value and is represented simply as a capacitor.

In the diagram of FIG. 1, the reference Amp indicates a current sense element (in embodiments, a shunt resistor, namely Rshunt, as conventional in the art) that senses the intensity of the current $I_D$ through the load L and the switch (MOSFET transistor) M1. In the diagram of FIG. 1, Vgs and Vds indicate the gate-source and drain-source voltages of the MOSFET transistor M1.

The eFuse device (hereinafter, eFuse) 10 is configured to monitor (via a current sensor Amp) the intensity of the current $I_D$ flowing through the load L. The eFuse 10 is configured to switch off the MOSFET transistor M1 based on the level of the current flowing through Rshunt.

At startup, one may assume that the load voltage is at ground level, the external switch (MOSFET transistor) M1 has never been switched on, and no current flows from the battery S (voltage $V_{CC}$) to and through the load L.

As noted, even if the load L can be per se a resistive or dynamic load, it may be assumed to include a large capacitive component (5-10 mF, for instance).

When the external switch (MOSFET transistor M1) is turned on—that is, made conductive—for the first time, the current $I_D$ will be determined by the saturation of the external MOSFET transistor M1, and it will have a (very) high-intensity value.

In fact, at startup Vds (e.g., with the drain of the external MOSFET M1 at battery level ($V_{CC}$) and the source of the external MOS at ground level), the MOSFET M1 will be in the saturation region. As a result, considering the transfer characteristic curve of a power MOSFET, with a maximum Vgs, the current $I_D$ will be substantially at its maximum intensity level.

The eFuse 10 will sense this high current via the current sensor Amp (e.g., via a shunt resistor Rshunt) and automatically activate protection in response to the current $I_D$ sensed being found to be higher than the intervention threshold ("hard-short" current) set for the eFuse. The eFuse will thus switch off the external MOSFET M1.

An attempt to overcome these drawbacks may involve somehow managing the charging of the load L by exploiting the saturation of the MOSFET transistor M1 and controlling the gate-source voltage Vgs. For instance, one may "move" along the transfer characteristic curves of the MOSFET transistor M1 by setting the gate-source voltage Vgs: the lower the Vgs, the lower the drain current $I_D$.

Controlling the voltage Vgs of the MOSFET transistor M1 facilitates pre-charging the load L using a controlled drain current $I_D$, without activating the eFuse protections (hard short protection).

In general terms, that strategy suffers from the fact that MOSFET transistors with (very) low "on" resistance Ron and high transconductance gm (as desired for eFuse applications) are affected by thermal instability ("hot spotting").

Controlling saturation of a MOSFET transistor having a low Ron value may suffer from an inherent drawback related to the specific internal structure of a MOSFET transistor.

Figure 2:
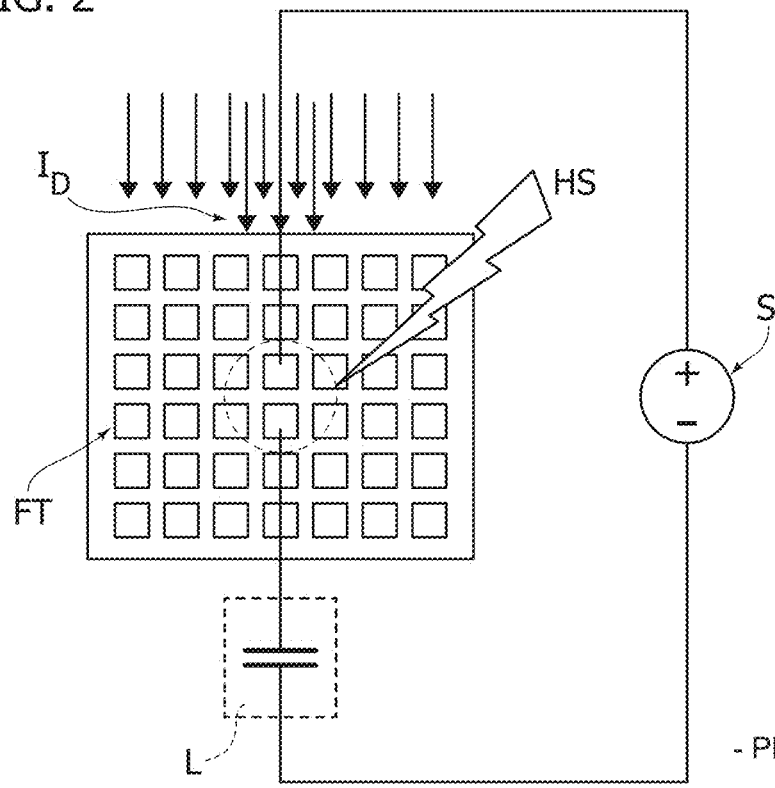
FIG. 2 is illustrative of certain phenomena that affect the operation of a field-effect transistor (FET)

As illustrated in FIG. 2, a FET transistor FT composed of a plurality of MOSFET cells can obtain a low Ron value. The cells are arranged electrically in parallel, and the current $I_D$ flows through each cell. Each cell has a high value for Ron; however, because the cells are arranged in parallel, the global Ron of the MOSFET transistor is (much) lower than the Ron of each MOSFET cell. During operation at a high current, the FET transistor generates dissipated heat flowing to the surrounding area. As a result, the temperature of the FET dissipating area becomes inevitably higher than the external temperature, with a max peak temperature in a central "hot spot" HS of the FET itself.

The trend to reduce the geometrical dimensions of such FETs leads to concentrating heat dissipation in a smaller area, making the "hot spot" problem even more severe. It is noted that the drain current of a MOSFET transistor starts flowing when the gate-source voltage Vgs becomes higher than a threshold Vth, namely when the overdrive (Vgs−Vth) takes a positive value. The higher the overdrive, the higher the current's intensity flowing through the MOSFET transistor's open channel.

It is likewise noted that the threshold Vth decreases as temperature increases. Therefore, since the central area of a transistor, as illustrated in FIG. 2, has a higher temperature than the peripheral areas, the central area will have a lower value for Vth than the rest of the transistor structure.

Assuming the gate-source voltage Vgs is maintained constant, the overdrive of the central area will bring more current to the central area. In that way, a loop is created: more current is brought to the central area, and higher power dissipation will occur in that area, causing this area to warm up further with Vth lowered, with even more current flowing through the central area. The structure may thus burn, creating a short circuit.

This thermal instability becomes even more critical in eFuse applications.

A MOSFET transistor for eFuse applications may have a low Ron, which can be related to a high density of cells in the MOSFET structure (see FIG. 2). A high transconductance gm, a high current density through the MOSFET transistor, and a high current handling capability at a low gate-source voltage: $gm=2(I_D/Vov)$, where Vov denotes the overdrive voltage. A low Ron and high gm lead to an increase in the zero-temperature coefficient of the MOSFET transistor, currently referred to as zero "tempco," ZTC.

As illustrated in FIG. 3, the ZTC point lies at the intersection of the transfer characteristics $I_D$ v. Vgs at different junction temperatures Tj (e.g., Tj=25° C.,-55° C. or 150° C.). The ZTC point is the gate-source voltage for which the device current remains stable.

For Vgs>$Vgs_{ZTC}$, the drain current tends to decrease when the device temperature rises, leading to a thermal stability condition. For V_gs<$Vgs_{ZTC}$, the drain current tends to increase when the device temperature rises, leading to a thermal instability condition.

Solutions as exemplified herein (see FIG. 4 by example) again refer to a high-side configuration, wherein the drain of an external MOSFET transistor such as M1 is connected to a battery S. In contrast, the source of the transistor M1 is connected to a load.

As noted, corresponding numerals and symbols in the different figures generally refer to corresponding parts unless otherwise indicated, and a detailed description will not be repeated for every figure for brevity.

Figure 4A:
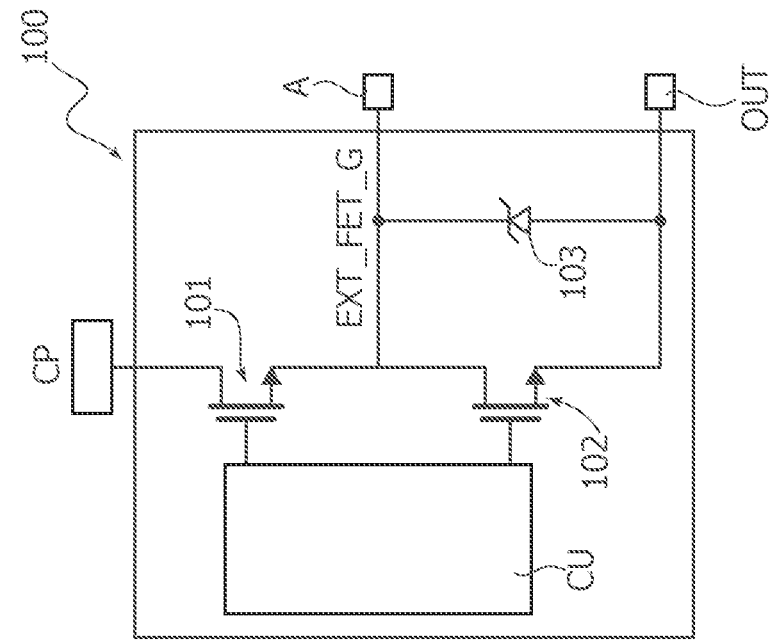
FIG. 4A is a circuit diagram illustrative of possible details of the eFuse circuit of FIG. 4.
Figure 4:
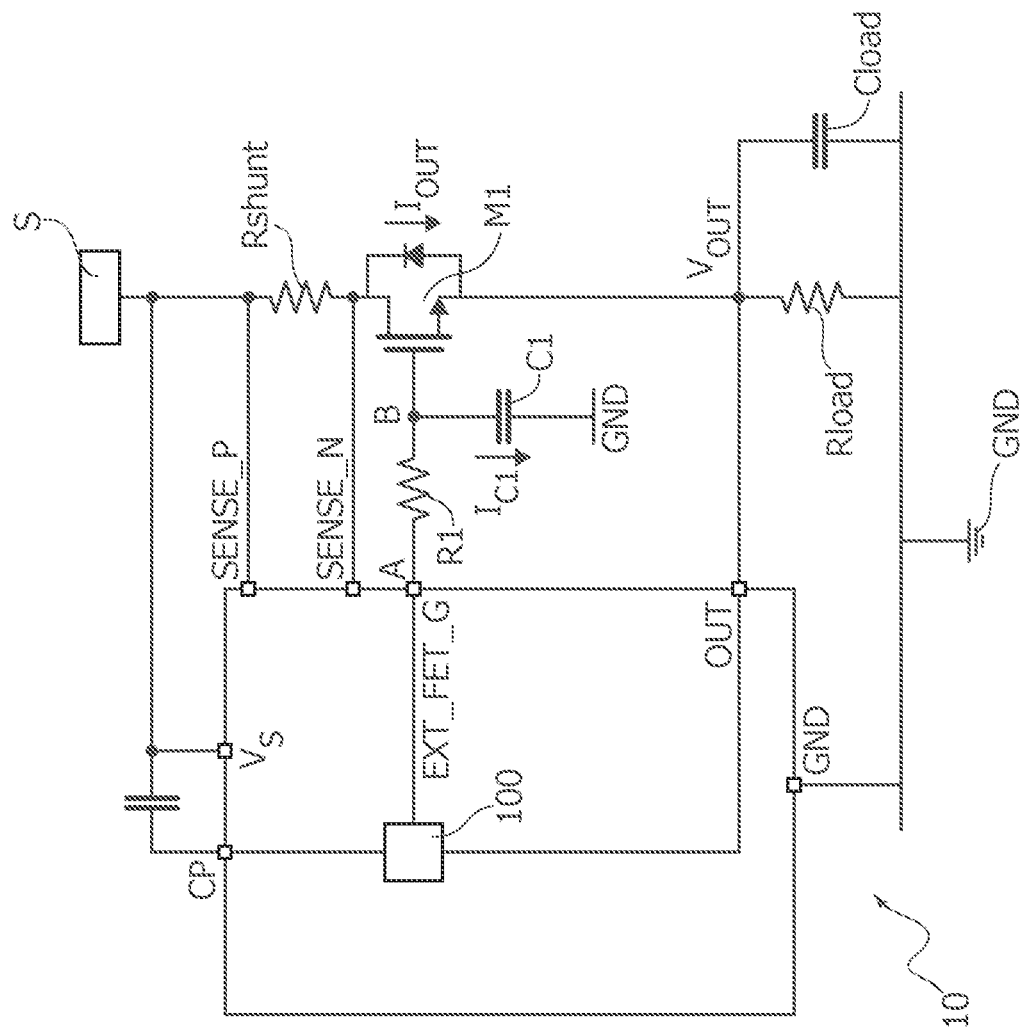
FIG. 4 is a circuit diagram of an eFuse circuit according to a first possible implementation of an eFuse according to the present description.

FIG. 4 highlights that the load (to which an output voltage $V_{OUT}$ is applied) can be per se a resistive load as exemplified by Rload, which, however, may be assumed to include a large capacitive component Cload (5-10 mF, for instance).

A solution as exemplified herein addresses the thermal instability problem discussed in the preceding driving the gate of the (external) MOSFET transistor M1 with a variable gate-source voltage Vgs, so that the overdrive (Vgs–Vth), and therefore the current $I_{OUT}$ supplied to the load Rload, Cload (drain current of the MOSFET transistor), is kept constant.

The current $I_{OUT}$ can be calculated as follows: $I_{OUT}=k_{M1} * (V_{gsM1}-V_{thM1})^2$, wherein $K_{M1}$ is a constant related to the physical structure of the external MOSFET transistor M1: therefore, if the overdrive $V_{gsM1}-V_{thM1}$ is kept constant, there will be no increase of $I_{OUT}$. $V_{gsM1}$ denotes the gate-source voltage of the MOSFET transistor M1. It is otherwise noted that $V_{thM1}$ is the lowest (minimum) threshold value among the MOS cells of the external MOSFET transistor M1 (see FIG. 2).

The internal area of the MOSFET transistor M1 will be at a higher temperature concerning the other areas. However, the reduction in Vth will not be followed by an increase of $I_{OUT}$ provided; if Vth decreases, Vgs is likewise reduced, thus avoiding an increase of $I_{OUT}$. In other words, increasing $I_{OUT}$ automatically causes a decrease in Vgs, keeping the overdrive constant.

According to the first implementation illustrated in FIG. 4, the eFuse 10 includes an output node A. There a signal EXT_FET_G is produced to be applied via a drive node B to the control terminal (gate, in the case of a field-effect transistor such as the MOSFET transistor M1) via an RC low-pass circuit comprising a resistor R1 coupled between the node A and the node B and a capacitor C1 coupled between the node B and ground. The RC circuit is not envisaged to be integrated into the eFuse 10 due to the size of its components.

The external MOSFET transistor M1 can thus be operated in saturation as a source follower. In other words, the output voltage $V_{OUT}$ on the load Rload, Cload (the source of the MOSFET transistor M1) will follow the voltage level of node B, namely, the gate voltage of the external MOSFET transistor M1.

The overdrive is kept constant if $dV_B/dt=dV_{OUT}/dt$. If the equality is achieved and one considers that C1=Cload/k, then the current $I_{C1}$ through the capacitor C1 is equal to ICload/k, thus making it possible to control the current flowing through Cload.

The structure illustrated in FIG. 4 is based on an open loop topology, where Vgs is not constant. Vgs is not constant since the MOSFET transistor M1 is connected to the node OUT coupled to the load, while the capacitor C1 is connected to ground GND. In other words, there is no dependence between $I_{C1}$ and $I_{Cload}$ (the current through the capacitor Cload). The voltage $V_{OUT}$ increases as a function of the voltage level of node B and not vice-versa. The structure illustrated in FIG. 4 is an open-loop topology, where $I_{Cload}$ is controlled by controlling $dV_B/dt$, which is the voltage variation at node B.

By way of further detail, the structure illustrated in FIG. 4 comprises a gate driver circuit (GD) 100 arranged between a node CP coupled to the battery S (e.g., via a capacitor that is illustrated while not expressly labeled for simplicity).

As illustrated in FIG. 4, the eFuse 10 includes two sensing nodes SENSE_P, SENSE_N that sense the voltage drop across the shunt resistor. Thus, the current $I_{OUT}$ supplied to the load Rload, Cload through the current flow path (source-drain, in the case of a field-effect transistor such as a MOSFET transistor) through the MOSFET transistor M1 to provide a sensing signal at a node Vs. A possible structure for a gate driver circuit (GD) 100 is illustrated in FIG. 4A.

Essentially, the gate driver circuit 100 comprises a first electronic switch 101 and a second electronic switch 102 (MOSFET transistors, for instance) arranged with the current flow paths therethrough (source-drain in the case of a field-effect transistor such as MOSFET transistors) cascaded in a current flow line between the node CP and the output node OUT.

The node A from which the signal EXT_FET_G is derived is arranged at the current flow line between the node CP and the output node OUT in an intermediate position with respect the transistors 101 and 102.

A Zener diode 103 (e.g., with 20V Zener voltage) is arranged between node A and the output node OUT. With the shown polarities, the Zener diode is arranged with its cathode and anode towards node A and the output node OUT, respectively.

As illustrated in FIGS. 4 and 4A, at power-up a voltage step is provided as an input to the eFuse, causing the voltage EXT_FET_G (node A) to rise from 0V above $V_{OUT}$ to 20V (the Zener voltage of the diode 103) above $V_{OUT}$. This may occur in response to a drive signal being applied (in a manner known per se to those of skill in the art) to the drive terminals (gates in the case of field-effect transistors such as MOSFET transistors) of the transistors 101 and 102 via a control unit CU (a microcontroller, for instance) included, in a manner known per se to those of skill in the art, in the eFuse 10.

The (e.g., 20V) Zener diode 103 is configured to protect the control terminal (gate, in the case of a field-effect transistor such as a MOSFET transistor) of the external MOSFET transistor M1. An external MOSFET transistor, such as the MOSFET transistor M1 is configured to withstand a gate-source voltage Vgs of 20V maximum.

If, for example, the node CP is 14V above Vs (e.g., equal to 20V), considering $V_{OUT}$=0V (at power-up), without the (e.g., 20V) Zener diode 103, the gate-source Vgs will be equal to 34V with the risk of damaging the MOSFET transistor M1.

Due to the presence of the 20V Zener diode, when the Vgs of the external MOSFET transistor M1 tends to increase above, e.g., 20V, the, e.g., 20V Zener diode 103 will clamp the gate voltage of the external MOSFET transistor M1 at, e.g., 20V above $V_{OUT}$.

The signal EXT_FET_G will be at, e.g., 20V above $V_{OUT}$ when the Zener diode 103 becomes conductive, namely when the voltage $V_{OUT}$ reaches, e.g., 15V. As soon as the voltage $V_{OUT}$ reaches, e.g., 15V, the voltage difference across the Zener diode will be CP (e.g., 34V)–15V=19V, namely, the Zener diode 103 will be switched off. Following the switching off of the Zener diode 103, the signal EXT_FET_G will remain at CP.

In response to the step input provided at node A, node B (the gate in the case of a field-effect transistor such as the MOSFET transistor M1) will try to reach the voltage at node A with an exponential behavior determined by the network R1 and C1.

Figure 5:
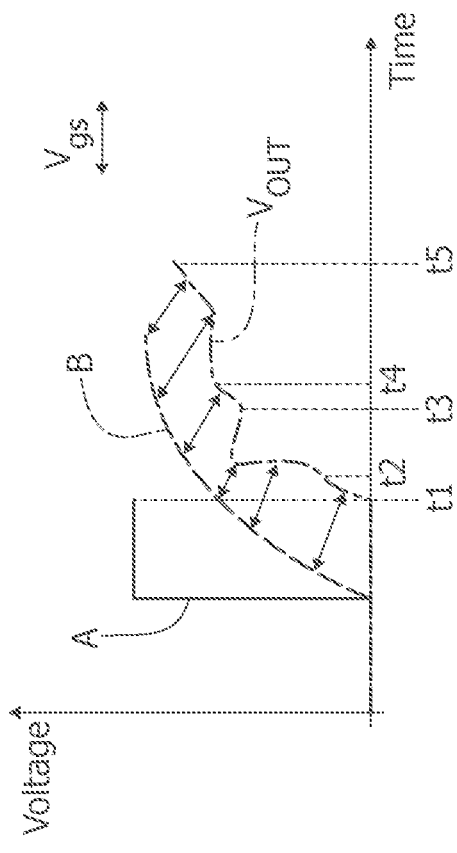
FIGS. 5 and 6 present various diagrams illustrative of the possible operation of the eFuse circuit of FIG. 4.

FIG. 5 portrays a possible behavior of the voltages at node A (continuous line), node B (dashed line) and $V_{OUT}$ (chain line), as discussed in the preceding. As soon as Vgs becomes greater than the threshold Vth (time t1), an overdrive is created and $V_{OUT}$ starts increasing (during the interval t1-t2).

In case of hot spotting (during the interval t2-t3), namely in case the external MOSFET transistor M1 heats up, the current $I_{OUT}$ increases. Therefore, the voltage $V_{OUT}$ increases faster than the voltage at node B (as discussed, the voltage $V_{OUT}$ increases in response to more current flowing towards the node OUT).

If the voltage $V_{OUT}$ increases, since the voltage at node B is independent of $V_{OUT}$, the voltage Vgs will decrease trying to switch the external MOSFET transistor M1 off (the source voltage of transistor M1 gets closer to its gate voltage). The decrease of the voltage Vgs will cause a reduction in the overdrive and therefore, the current $I_{OUT}$ will decrease. If the current $I_{OUT}$ decreases, the voltage $V_{OUT}$ will decrease, given that less current will flow towards the output node OUT, trying to keep the overdrive constant. If an additional load is added in parallel to the load Cload (during the interval t4-t5), there will be less current flowing in the load Cload, and the voltage VOUT will remain almost constant or increase slower than before. Therefore, considering that the voltage at node B increases independently of the voltage $V_{OUT}$, the voltage Vgs (and the overdrive) will increase. In response to the increase in the overdrive, the current $I_{OUT}$ will increase. Consequently, the voltage $V_{OUT}$ will rise again, trying to keep the overdrive constant.

Figure 6:
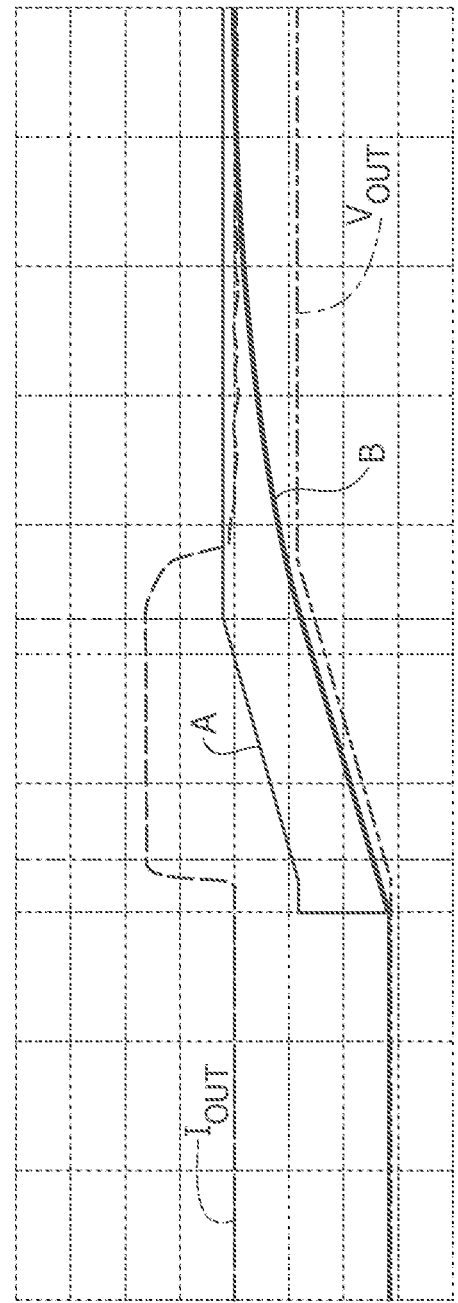

FIG. 6 illustrates a possible time behavior of the voltages at nodes A and B, the voltage $V_{OUT}$ and the current $I_{OUT}$, which is kept essentially constant over time. It is noted that the choice of the resistance/capacitance values for R1 and C1 depends on the desired $dV_B/dt$, that in the RC network comprised of R1 and C1 is given by the relationship: $Vc(t)=Vi*(1-e^{(-t/\tau)})$, where Vc(t) is the voltage across C1 at the time t, Vi is the input voltage, and $\tau=R1*C1$.

Figure 8:
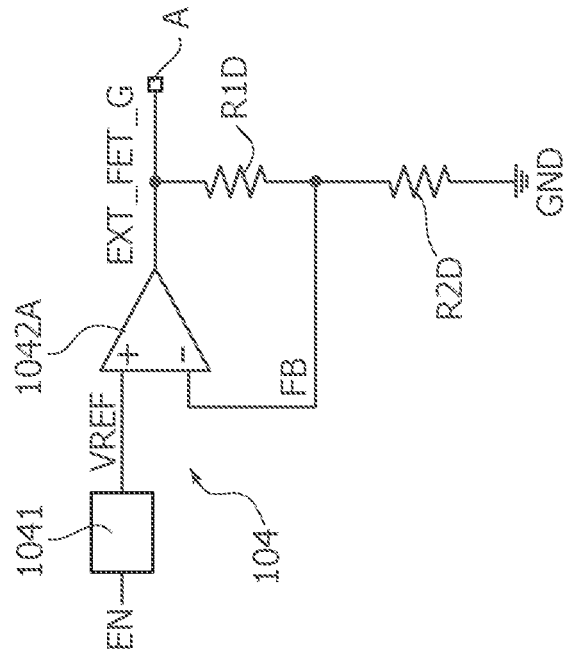
FIGS. 8 and 9 are circuit diagrams illustrative of possible details of the eFuse circuit of FIG. 7.
Figure 7:
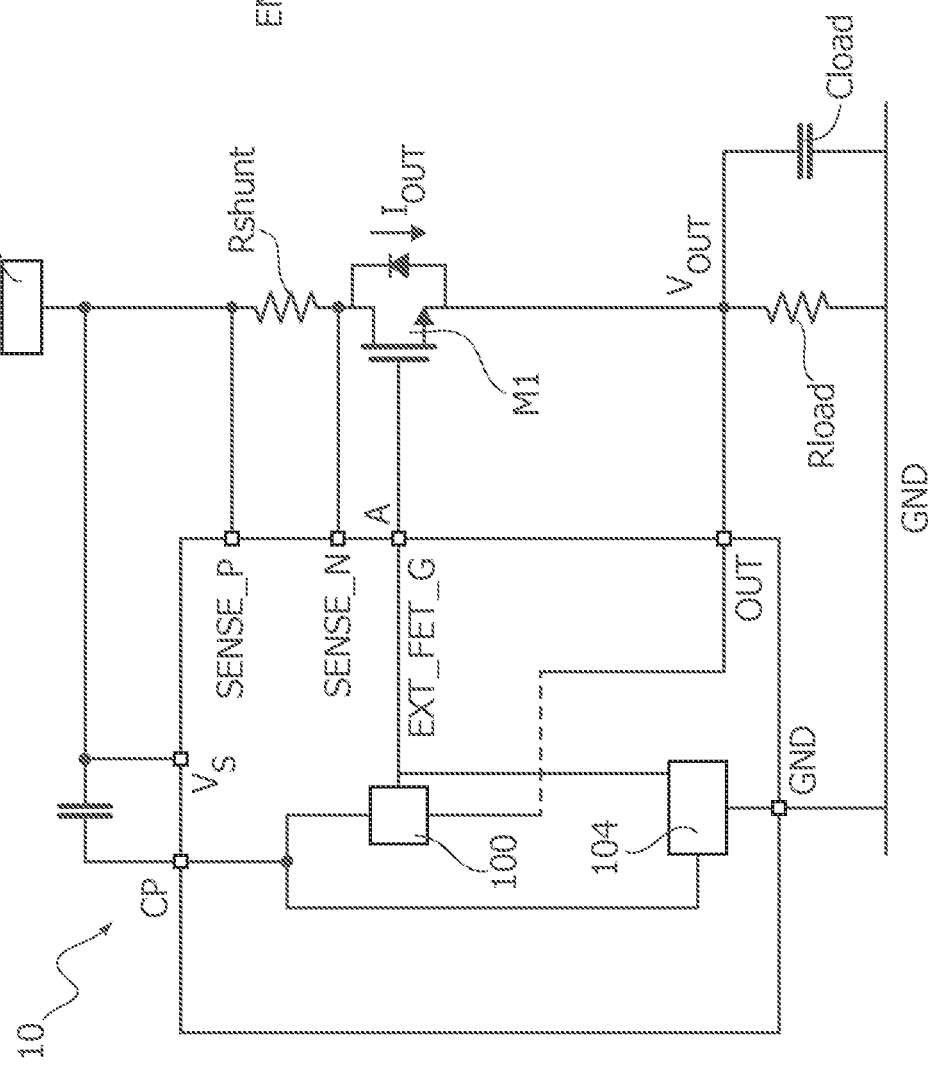
FIG. 7 is a circuit diagram of an eFuse circuit according to a second possible implementation of an eFuse according to the present description.
Figure 9:
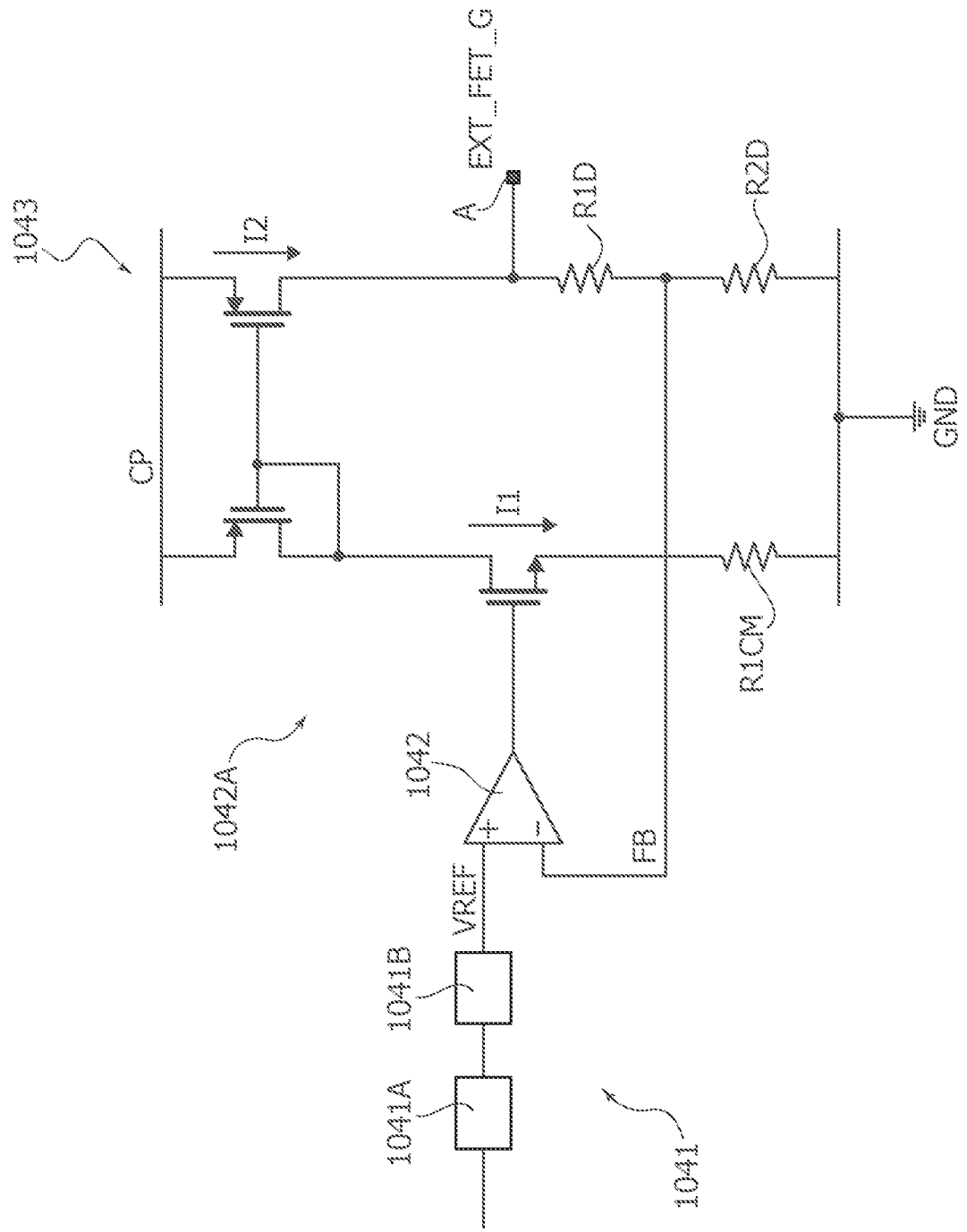

FIGS. 7 to 9 illustrate a second possible implementation of the proposed solution. Again, parts or elements already described in the preceding (e.g., in connection with FIGS. 4 and 4A) are indicated with reference symbols, and a corresponding description will not be repeated.

In the implementation of FIGS. 7 to 9, a signal generator 104 is integrated inside the eFuse 10 to produce a configurable $dV_{gate}/dt$ behavior of a voltage $V_{gate}$ at the node A to drive the control terminal (here, gate) of the MOSFET transistor M1 in a manner compliant with the relationship $dV_B/dt=dV_{OUT}/dt$ discussed in the preceding.

A possible implementation of the signal generator 104 (arranged between the node CP and ground GND, for instance) is illustrated in FIG. 8. There, a ramp generator 1041 is shown configured to receive an enable signal EN and to deliver an output reference voltage VREF to (the, e.g., non-inverting input of) a "high-voltage" operational amplifier 1042A. The output from the operational amplifier 1042A provides an output signal towards node A and is also coupled to a resistive voltage divider R1D, R2D between the output from the operational amplifier 1042A and ground. The output of the divider (at an intermediate point between the resistors R1D and R2D) provides a scaled-down replica of the output signal at node A as a feedback signal FB towards the (e.g., inverting input of) the operational amplifier 1042A. The ramp generator 1041 produces a signal with a configurable behavior in terms of $dV_{REF}/dt$. A gain factor can be applied to that signal via the operational amplifier 1042A and the resistive divider R1D, R2D, the equivalent gain G being set as G=(R1D+R2D)/R2D.

For instance, the high-voltage operational amplifier 1042A can be implemented, as exemplified in FIG. 9, which is a combination of an operational amplifier 1042 and a level shifter 1043.

For instance (as illustrated in FIG. 9), taking into account the charge pump supply, the supply of the operational amplifier 1042 may be referred to an internal low-voltage range with the output from the operational amplifier 1042 coupled to the node providing the signal at the node A via a level shifter including a current mirror arrangement, designated 1043 as a whole.

As illustrated, the current mirror arrangement 1043 is coupled between the node CP and ground GND and comprises a first branch (including a tail resistor R1CM) coupled to the output from the operational amplifier 1042 and through which a first current I1 flows and a second branch coupled to the node providing the signal HS_GATE through which a second current I2 flows that "mirrors" the first current I1.

FIG. 9 also shows that the ramp generator 1041 can be implemented as a cascaded arrangement of a digital counter 1041A and a digital-to-analog converter 1041B. Circuit 104 (ramp generator 1041, op-amp 1042, current mirror 1043) will drive the node where the signal HS_GATE is present (to be supplied to the control terminal, e.g., gate of the external MOSFET transistor M1) in such a way that the corresponding voltage level will increase from 0V towards the voltage at the node CP with a stepped shape. Conversely, that voltage will increase slowly step-by-step in a predefined time interval $\Delta t$ (e.g., a time interval nearly equal to 100ms).

The duration of $\Delta t$ can be tuned so that, based on the capacitance value Cload (and that Cload is desired to be charged to reach battery level) the current $I_{Cload}$ flowing through the capacitance Cload can be determined as follows: $I_{Cload}$=Cload*($\Delta V/\Delta t$), where $\Delta V$ is the battery voltage level with respect to ground.

The voltage at node A will increase independently of $V_{OUT}$ so that the gate-source voltage Vgs of the MOSFET transistor M1 can decrease/increase to keep the overdrive constant, just like in the first implementation discussed in connection with FIGS. 4 and 4A, that is with the same Vgs compensation.

In the operation of the second implementation, illustrated in FIGS. 7 to 9, during the functioning of circuit 104, the output from the gate driver circuit 100 is in a high impedance state so that circuit 104 can drive the control terminal (here, gate) of the external MOSFET transistor M1 without being hindered by the gate driver circuit 100.

Vice-versa, the output from circuit 104 is in a high impedance state when the gate of the control terminal (here, gate) of the external MOSFET transistor M1 is desired to be increased/decreased quickly, e.g., when the capacitance Cload is already at the battery level.

As soon as circuit 104 is activated (via the enable signal EN), the digital counter 1041A starts to count with a certain frequency. The counter frequency may be configurable by the user, e.g., via a dedicated RAM register, and can produce a $dV_{gate}/dt$ time behavior as desired. The DAC converter 1041B translates the digital counter output to an analog voltage level that acts as the input to the voltage level shifter 1042, 1043. This facilitates shifting the DAC output voltage to an acceptable voltage for the control terminal (here, gate) of the MOSFET transistor M1.

For instance, the gain of level shifter can be set to $V_{HS\_GATE\_MAX}/V_{DAC\_MAX}$, where $V_{HS\_GATE\_MAX}$ and $V_{DAC\_MAX}$ indicate the maximum (voltage) values for the signal HS_GATE and the DAC output.

After activation of circuit 104, the described chain increases the voltage level of the control terminal (here, gate) of the external MOSFET transistor M1 from 0V towards the voltage level of the node CP with a stepped trend. The external MOSFET transistor M1 operates as a source follower, and as soon as Vgs exceeds Vth, the voltage $V_{OUT}$ applied to the load starts increasing with a stepped trend following the gate.

As discussed in FIG. 9, the level shifters 1042, 1043 can be implemented with an operational amplifier, a mirror supplied by a charge pump and a resistor ladder.

For instance, the non-inverting input of the operational amplifier 1042 can be handled by the DAC converter 1041B is such a way that, after a one-step increment, the non-inverting input of the operational amplifier is higher than the inverting input. The operational amplifier is unbalanced and increases its output, increasing the current I1, increasing the voltage at node A, and, consequently, the non-inverting input of the operational amplifier.

The operational amplifier 1042 increases its output generating a higher current I1 through the resistor R1CM. The current I2 mirrors I1 and is used to charge the input capacitance of the external MOSFET transistor M1 and feed the resistor ladders (divider) R1D, R2D used to generate the feedback voltage FB for the inverting input of the operational amplifier 1042. The feedback voltage FB is increased, and the inputs of the operational amplifier 1042 are balanced till the next step of the digital counter.

The second implementation described in connection with FIGS. 7 to 9 comprises a monitoring feature of the load voltage Vou, namely constant monitoring of the drain-source voltage of the MOSFET transistor M1: in response to this being lower than a threshold, circuit 104 is turned off and set to a high impedance state. Following the activation of the gate driver, the device will function essentially like the conventional eFuse device illustrated in FIG. 1.

The second implementation described in connection with FIGS. 7 to 9 may likewise comprise diagnostic controls for the possible failure of circuit 104. For instance, the device may constantly monitor the current through the external MOSFET transistor M1 using the shunt resistor Rshunt, and overcurrent (OVC) and HSC (hard short circuit: a current threshold for which the MOSFET transistor M1 is instantaneously turned off) thresholds may be configured during operation of the circuit 104 according to the accepted current.

For instance, the device may constantly monitor the voltage $V_{OUT}$ applied to the load. If the voltage $V_{OUT}$ is "stuck" to a voltage, but circuit 104 is found to try to increase the gate voltage, the continuous conduction mode (CCM) of operation of circuit 104 is blocked.

Circuit 104 can increase the voltage level of the control terminal (gate, in the case of a field-effect transistor) of the external MOSFET transistor M1 from 0V towards the voltage at the node CP, and the 104 can maintain the voltage of CP on that control terminal.

In certain situations, circuit 104 can be switched off before the control terminal (gate, in the case of a field-effect transistor) of the external MOSFET transistor M1 reaches the voltage at CP. Then the gate driver 100 will increase the voltage of that gate terminal to CP. The voltage level at that gate with circuit 104 depends on the charging current of the capacitance Cload and the gate-source voltage Vgs involved in that specific charging circuit.

For instance, if the current in the current flow path (source-drain, in the case of a field-effect transistor) of the external MOSFET transistor M1 is 10 A, Vgs is 6.5V, and Vth=3V, circuit 104 will increase the voltage of the gate of M1 from 0V to 6.5V over battery level, to increase the voltage $V_{OUT}$ to battery level, and the gate of the transistor M1 will not reach CP.

Then the gate driver 100 will suddenly increase towards the voltage of the node CP the voltage at the gate of the transistor M1, without incurring any thermal instability risk insofar as the voltage Vds is low (with the capacitance Cload completely charged).

Without prejudice to the underlying principles, the details and the embodiments may vary, even significantly, concerning what has been described by way of example, without departing from the scope of the embodiments.

What is claimed is:

1. A method for controllably transferring electrical charge from a supply voltage to a capacitive load, the method comprising:
   coupling the capacitive load to the supply voltage through a drain to source current flow path of a transistor;
   charging, by a drive circuit, the capacitive load by making the transistor selectively conductive in response to a gate-source voltage of the transistor exceeding a threshold voltage, wherein a difference between the gate-source voltage and the threshold voltage provides an overdrive value;
   a ramp generator circuit configured to generate a controlled ramp signal;
   driving, by the drive circuit, a gate terminal of the transistor with the controlled ramp signal such that the overdrive value is constant, the controlled ramp signal being a variable gate-source voltage; and
   providing, by a level shifter circuit, a level-shifted replica of the controlled ramp signal, the level shifter circuit arranged in a cascaded arrangement with the ramp generator circuit.

2. The method of claim 1, wherein the ramp generator circuit comprises a cascaded arrangement of a digital counter circuit and a digital-to-analog converter (DAC).

3. The method of claim 1, wherein the level shifter circuit comprises:
   an amplifier coupled to an output terminal of the ramp generator circuit; and
   a current mirror circuit coupled between the output terminal of the amplifier and the gate terminal of the transistor.

4. A circuit, comprising:
   a transistor;
   a capacitive load couplable to a supply voltage through a drain to source current flow path of the transistor; and
   a drive circuit comprising a ramp generator circuit in a cascade arrangement with a level shifter circuit, the ramp generator circuit coupled to a gate terminal of the transistor, the drive circuit configured to:
   charge the capacitive load by making the transistor selectively conductive in response to a gate-source voltage of the transistor exceeding a threshold voltage, wherein a difference between the gate-source voltage and the threshold voltage provides an overdrive value,
   drive the gate terminal of the transistor with a controlled ramp signal provided by the ramp generator circuit such that the overdrive value is constant to controllably transfer electrical charge from the supply voltage to the capacitive load, the controlled ramp signal being a variable gate-source voltage, and provide a level-shifted replica of the controlled ramp signal by the level shifter circuit.

5. The circuit of claim 4, wherein the ramp generator circuit comprises a cascaded arrangement of a digital counter circuit and a digital-to-analog converter (DAC).

6. The circuit of claim 4, wherein the level shifter circuit comprises:
an amplifier coupled to an output terminal of the ramp generator circuit; and
a current mirror circuit coupled between the output terminal of the amplifier and the gate terminal of the transistor.

7. A device, comprising:
a supply voltage;
a transistor coupled to the supply voltage;
a capacitive load coupled to the supply voltage through a drain to source current flow path of the transistor; and
a drive circuit comprising a ramp generator circuit in a cascade arrangement with a level shifter circuit, the ramp generator circuit coupled to a gate terminal of the transistor, the drive circuit configured to:
charge the capacitive load by making the transistor selectively conductive in response to a gate-source voltage of the transistor exceeding a threshold voltage, wherein a difference between the gate-source voltage and the threshold voltage provides an overdrive value,
drive the gate terminal of the transistor with a controlled ramp signal provided by the ramp generator circuit such that the overdrive value is constant to controllably transfer electrical charge from the supply voltage to the capacitive load, the controlled ramp signal being a variable gate-source voltage, and provide a level-shifted replica of the controlled ramp signal by the level shifter circuit.

8. The device of claim 7, wherein the device further comprises an electronic fuse.

9. The device of claim 7, wherein the level shifter circuit comprises:
an amplifier coupled to an output terminal of the ramp generator circuit; and
a current mirror circuit coupled between the output terminal of the amplifier and the gate terminal of the transistor.

10. The device of claim 7, wherein the ramp generator circuit comprises a digital counter circuit in a cascade arrangement with a digital-to-analog converter (DAC).

11. The device of claim 7, further comprising:
a voltage monitoring circuit configured to monitor a voltage applied to the capacitive load; and
a control circuit configured to turn off the ramp generator circuit and set it to a high impedance state in response to the monitored voltage being lower than a threshold.

12. The device of claim 7, further comprising:
a shunt resistor arranged to monitor a current through the transistor; and
a control circuit configured to set overcurrent and hard short circuit thresholds during operation of the ramp generator circuit according to an accepted current level measured by the shunt resistor.

13. The method of claim 1, further comprising:
monitoring a voltage applied to the capacitive load; and
turning off the ramp generator circuit in response to the monitored voltage being lower than a threshold and setting it to a high impedance state.

14. The method of claim 1, further comprising:
monitoring a current through the transistor using a shunt resistor; and
configuring overcurrent and hard short circuit thresholds during an operation of the ramp generator circuit according to an accepted current level.

15. The method of claim 1, further comprising:
monitoring a voltage applied to the capacitive load; and
blocking a continuous conduction mode of operation of the ramp generator circuit in response to the monitored voltage being stuck at a constant voltage level during the period the ramp generator circuit is increasing the gate voltage of the transistor.

16. The method of claim 1, wherein the ramp generator circuit is configured to increase the gate voltage of the transistor from a reference voltage towards the supply voltage in predefined time intervals.

17. The circuit of claim 4, further comprising:
a voltage monitoring circuit configured to monitor a voltage applied to the capacitive load; and
a control circuit configured to turn off the ramp generator circuit and set it to a high impedance state in response to the monitored voltage being lower than a threshold.

18. The circuit of claim 4, further comprising:
a shunt resistor arranged to monitor a current through the transistor; and
a control circuit configured to set overcurrent and hard short circuit thresholds during operation of the ramp generator circuit according to an accepted current level measured by the shunt resistor.

19. The circuit of claim 4, further comprising:
a voltage monitoring circuit configured to monitor a voltage applied to the capacitive load; and
a control circuit configured to block a continuous conduction mode of operation of the ramp generator circuit in response to the monitored voltage being stuck at a constant voltage level during the period the ramp generator circuit is increasing the gate voltage of the transistor.

20. The circuit of claim 4, wherein the ramp generator circuit is configured to increase the gate voltage of the transistor from a reference voltage towards the supply voltage in predefined time intervals.

* * * * *